United States Patent [19]

Linnebach et al.

[11] Patent Number: 4,934,315

[45] Date of Patent: Jun. 19, 1990

[54] SYSTEM FOR PRODUCING SEMICONDUTOR LAYER STRUCTURES BY WAY OF EPITAXIAL GROWTH

[75] Inventors: Richard Linnebach, Erdmannhausen; Bernward Gohla, Stuttgart, both of Fed. Rep. of Germany

[73] Assignee: Alcatel N.V.

[21] Appl. No.: 262,093

[22] Filed: Oct. 19, 1988

Related U.S. Application Data

[63] Continuation of Ser. No. 946,134, Dec. 23, 1986, abandoned, which is a continuation of Ser. No. 757,100, Jul. 19, 1985, abandoned.

[30] Foreign Application Priority Data

Jul. 23, 1984 [DE] Fed. Rep. of Germany ....... 3427057

[51] Int. Cl.$^5$ ............................................. C23C 16/54
[52] U.S. Cl. .................................... 118/719; 118/729; 118/733
[58] Field of Search ...................... 118/50.1, 719, 729, 118/733

[56] References Cited

U.S. PATENT DOCUMENTS

| | | | |
|---|---|---|---|
| 4,089,735 | 5/1978 | Sussman | 118/729 X |
| 4,313,254 | 2/1982 | Feldman | 427/74 X |
| 4,358,472 | 11/1982 | Small et al. | 427/10 |
| 4,430,149 | 2/1984 | Berkman | 156/613 |

FOREIGN PATENT DOCUMENTS

| | | |
|---|---|---|
| 1241483 | 10/1983 | Australia . |
| 2061083 | 5/1984 | Australia . |
| 8813682 | 5/1986 | Australia . |
| 1644183 | 10/1986 | Australia . |
| 1665883 | 11/1986 | Australia . |
| 1764683 | 11/1986 | Australia . |
| 2107583 | 4/1987 | Australia . |
| 2245383 | 8/1987 | Australia . |
| 1260233 | 1/1972 | United Kingdom . |

*Primary Examiner*—Evan Lawrence
*Attorney, Agent, or Firm*—Spencer & Frank

[57] ABSTRACT

A system for vapor phase deposition wherein a wafer is heated inside a reaction space and exposed to a gas flow in which the coating substance is contained in the form of an organometallic compound, and is deposited as a monocrystalline layer, by way of gas reactions, on to the wafer. On order to increase productivity, a holder supporting a stack of wafers is moved from a loading station into a reaction region and, with the aid of a stepping motor driving mechanism, is successively transferred through the reaction region, and finally placed into an unloading station. During the loading and the unloading of the holders supporting the wafers, the reaction region is prevented from being contaminated by the atmosphere. A transfer system for the wafers includes driving mechanisms which allow transfer of wafers through the reaction region in either of two opposing directions.

3 Claims, 3 Drawing Sheets

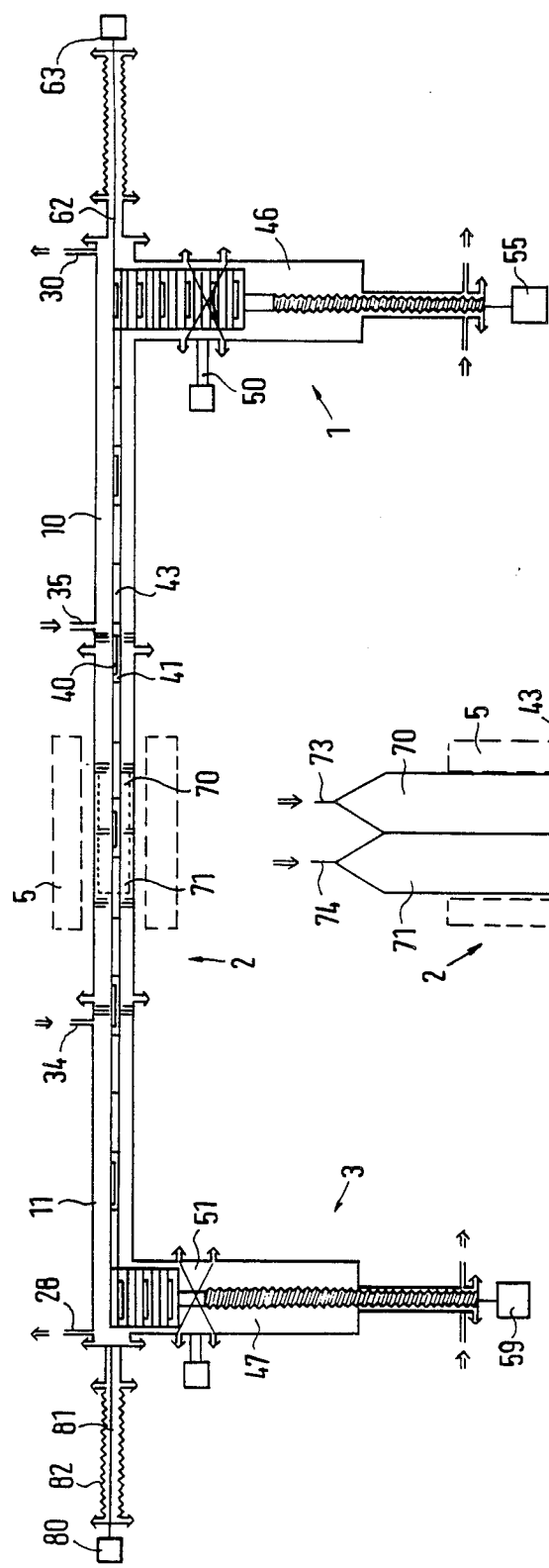

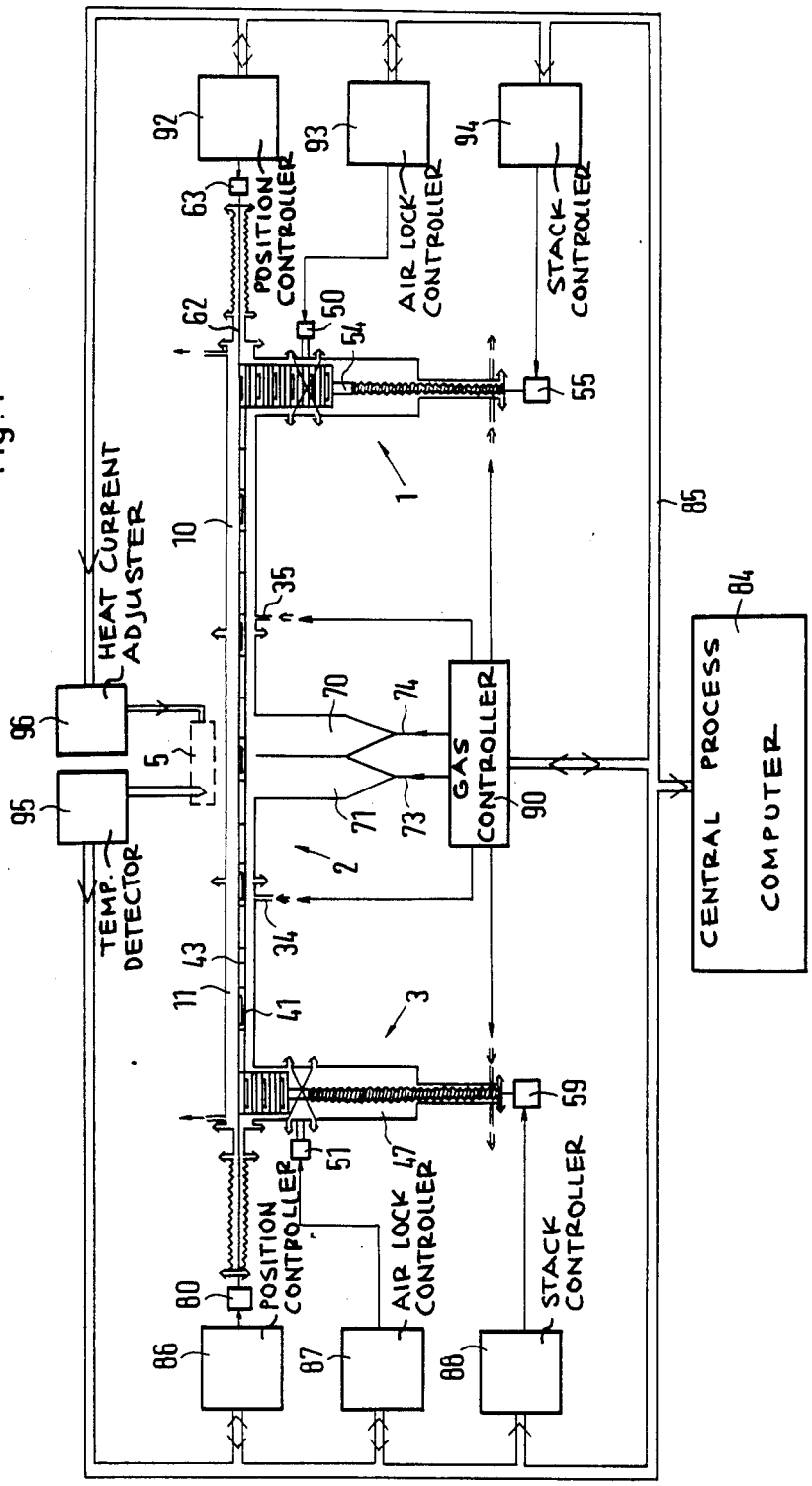

4,934,315

SYSTEM FOR PRODUCING SEMICONDUTOR LAYER STRUCTURES BY WAY OF EPITAXIAL GROWTH

This application is a continuation of application Ser. No. 06/946,134, filed Dec. 23, 1986, now abandoned, which is a continuation of application Ser. No. 06/757,100, filed July 19, 1985, now abandoned.

BACKGROUND OF THE INVENTION

1. Field of the Invention

The invention relates to a system for producing semiconductor layer structures by way of epitaxial growth.

2. Discussion of the Prior Art

It is known to deposit a monocrystalline semiconductor layer, e.g., of GaAs and related III-V compounds onto semiconductor wafers by way of epitaxial growth. According to the organometallic chemical vapor deposition (MOCVD technique, the semiconductor wafer to be coated is heated up to the required reaction temperature and is exposed to a gas flow which contains the coating substance in the form of a gaseous organometallic compound and deposits it on to the semiconductor wafer (cf. J. Vac. Sci. Technol., 18(3), April 1981, pp 753 to 755; J. of Crystal Growth 64 (1963), pp 461 to 470).

The conventional systems comprise a reactor accessible from one side into which the semiconductor wafer to be coated is introduced upon opening the reactor. Thereupon, the reactor is closed and, if so required, filled with an inert gas, the semiconductor wafer is heated up to the required reaction temperature and is then exposed to the reaction gas flow. Each time that finished semiconductor wafers are to be removed from the reactor and new wafers are to be introduced, the reactor has to be cooled down to the ambient temperature, and opened. In so doing, ambient air also enters into the reactor so that thereupon the latter must be carefully deaerated. This results in idle time for the system which is long compared to the time of treatment. This also results in heat-energy losses because the reactor must be reheated each time.

SUMMARY OF THE INVENTION

It is an object of the invention to provide an epitaxial growth system which permits the economical production of larger numbers of semiconductor devices having layer structures.

By the invention, a quasi-continuous large-scale production of optical semiconductor devices is made possible. Such devices which have quaternary mixed-crystal layer structures, e.g., on the GaInAsP basis, are used, for example, in the manufacture of lasers, LEDs and photodetectors.

BRIEF DESCRIPTION OF THE DRAWINGS

Two examples of embodiments of the invention will now be explained with reference to FIGS. 1 to 4 of the accompanying drawings, in which:

FIG. 2 is a schematic of another embodiment of a system according to the invention, FIG. 3 shows part of the system as shown in FIG. 2 in a top view, and FIG. 4 is a schematic representation of a process controller for the system as shown in FIG. 2.

DETAILED DESCRIPTION OF THE INVENTION

Figure 1:
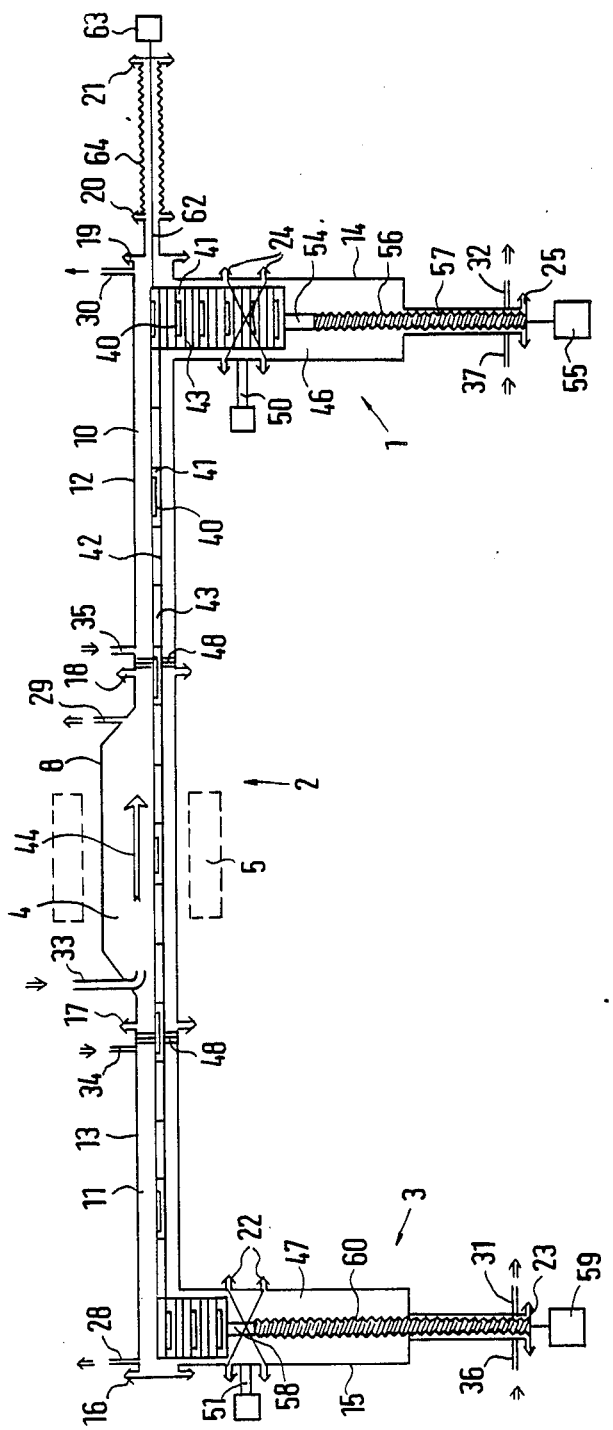
FIG. 1 is a schematic of a system according to the invention.

The system as shown in FIG. 1, for producing semiconductor layer structures by way of epitaxial growth consists of the following principal components:

A loading station 1, a reaction or epitaxial-growth region 2, and an unloading station 3. Within the epitaxial-growth region there is provided a reaction chamber 4 which, by means of a heating device 5, such as an r.f. heating element, is heated up to the necessary reaction temperature. The reaction chamber is enclosed by a quartz-glass envelope 8.

Between the loading station 1 and the reaction chamber 4 there is disposed a pre-chamber 10, and between the reaction chamber 4 and the unloading station 3 there is disposed a terminal chamber 11. Both the prechamber 10 and the terminal chamber 11 have envelopes or housings 12 or 13 respectively, of superrefined stainless steel. Likewise, also the housings 14 and 15 of the loading station 1 and the unloading station 3 are made of superrefined steel.

The various parts of the housing of the system are connected to one another at their connecting points or terminated at their front ends in a pressure-tight manner with the aid of sealing flanges 16 to 25. For the deaeration, that is, in particular, for producing an ultra-high vacuum, and for exhausting the reaction or inert gases, the individual parts of the housing are provided with vent pipes 28 to 32. Via an inlet pipe 33, the reaction gases are introduced into the reaction chamber 4, whereas further inlet pipes 34 to 37 serve to introduce inert gas into the loading station 1, into the unloading station 3, into the pre-chamber 10, and into the terminal chamber 11.

The semiconductor wafers 40 to be coated are introduced into the reaction chamber 4 by being supported on a holder 41. For this purpose, a slideway or guide rail 42 extends from the loading station 1 through the pre-chamber 10, the reaction chamber 4 and the terminal chamber 11 up to the unloading station 3, on which the holders 41 are moved forward—in the representation of FIG. 1 from right to left. Between each two successively following holders, one or more spacing members 43 are forwarded on the slideway 42. The number of spacing members 43 which, in their outer dimensions, correspond to those of the holders 41, is chosen thus that each time only one semiconductor wafer 40 is positioned inside the reaction chamber 4. The direction of flow of the reaction gases which enter into the reaction chamber 4 through the inlet tube 33, and leave the chamber via the exhaust tube 29, is indicated by the arrow 44. This direction is exactly in opposition to the direction in which the holders 41 are transferred.

The loading station 1 comprises a storage space 46 which is filled with a stack of supports 41 on which the semiconductor wafers 40 are supported, as well as with spacing members 43. The unloading station 3 is provided with a corresponding storage space 47 for taking up the holders 41 with the semiconductor wafers 40, as well as the spacing members 43 after these have passed through the reaction region 2.

The reaction chamber 4 is separated from both the prechamber 10 and the terminal chamber 11 by diffusion baffles 48 which serve to keep the gas exchange between the reaction chamber and the pre- and terminal chambers as small as possible. When the reaction chamber has to be removed for cleaning, the pre-chamber 10 and the terminal chamber 11 can meanwhile be rinsed with inert gas. This reduces the partial volume of the system which, in the course of such a cleaning, has to be subjected to the atmosphere. The filling of the pre-chamber 10 and the terminal chamber 11 with an inert gas or an inert gas mixture also serves to protect the semiconductor wafers from damages caused by temperature.

To prevent the reaction chamber 4, the pre-chamber 10 and the terminal chamber 11 from coming into contact with the surrounding atmosphere during either the filling of the storage space 46 or the emptying of the storage space 47, and to avoid the disadvantageous interactions resulting therefrom, air-lock devices 50, 51 are inserted between each of the connections of the storage spaces 46, 47 and the housing member 12, 13 respectively, with the air-lock devices consisting, e.g., of a pendulum slide of high-grade steel, each with an electro-pneumatic driving mechanism. Before the storage space 46, 47 is opened or separated for filling or emptying, the chambers 10, 11 are hermetically sealed against the surrounding atmosphere by the action of the air-lock devices 50, 51 respectively.

From the storage space 46, the holders 41 with the semiconductor wafers 40 as well as the spacing members 43 are introduced one at a time in turn into the prechamber 10 and lifted to the level of the slideway 42. For this purpose, the piston 54 is actuated by a driving mechanism 55 which is appropriately designed as a stepping motor. A bellow or spring-bellow valve 56 of high-grade steel seals the grommet of the piston rod of the piston 54 as extending through the housing 57 of the driving mechanism against the surrounding atmosphere, so that in the case of an opened air-lock device 50 and a connected storage space 46 there is maintained the vacuum or the protective-gas atmosphere.

The unloading station 3, too, comprises a piston 58 with a driving mechanism 59, through which the individual holders 41 and the spacing members 43 are removed from the terminal chamber 11 and introduced into the storage space 47. Here, too, a bellows valve 60 takes care of the necessary sealing against the surroundings.

A pushrod 62 which is capable of being moved to and fro, as well as an associated driving mechanism 63 which is designed, e.g., as a stepping motor, form a transfer mechanism for pushing the holders 41 and the spacing members 43 through the pre-chamber 10, the reaction chamber 4 and the terminal chamber 11. This pushrod 62 is likewise sealed against the atmosphere by means of a high-grade steel bellows valve 64.

After the semiconductor wafer 40, as just positioned inside the reaction chamber 4, has been coated, the pushrod 62 pushes the holder 41 and the spacing member 43 by the length of one holder toward the left and then returns to its initial position. The piston 54 in the loading station 1 is then moved in the upward direction and lifts a further holder 41 or spacing member 43 up to the level of the slideway 42. The piston 58 of the unloading station 3, in turn, is moved in the downward direction, lowers the topmost one of the holders 41 or spacing members 43 as lying on the stack, thus providing room for the next part arriving on the slideway 42. This process is repeated until either the storage space 46 has become empty or the storage space 47 has become full. Thereafter, as already mentioned hereinbefore, the air-lock devices 50, 51 are closed, the storage space 46 with the holders 41 is filled with new semiconductor wafers, and the holders on which the already coated semiconductor wafers and the spacing members are removed from the storage space 47.

During the loading and unloading of the storage spaces 46, 47, the gas atmosphere inside the pre-chamber 10, the reaction chamber 4 and the terminal chamber 11 remain unaffected by the surrounding atmosphere. Above all, however, there is no need for the heating device 5 to be cooled down to ambient temperature and then being re-heated thereafter. For the heating device 5 it is possible, depending on the epitaxial process to be carried out, to use either a resistance-heated oven, a source of heat radiation, an induction heater, or any other source of heat.

Insofar as the system shown in FIGS. 2 and 3 is in agreement with the system described hereinbefore, identical individual elements thereof are indicated by the same reference numerals. Thus the function of these identical elements is not reexplained. Within its region of epitaxial growth 2 lying between the pre-chamber 10 and the terminal chamber 11, it comprises two chambers 70 and 71 disposed transversely in relation to the direction of transfer of the holders 41 supporting the semiconductor wafers 40 and the spacing members 43. Each of these reaction chambers is provided with an inlet tube 73, 74 through which the respective reaction gas in supplied, as well as with a deaerating or exhaust tube 75, 76. In order to avoid or to reduce a gas exchange between the reaction chambers 70, 71' a diffusion baffle 48 is likewise disposed between them.

In this way, two different crystal layers can be deposited on to the semiconductor wafer 40, one at a time in turn. Accordingly, it is possible with the aid of this system to carry out, in an advantageous manner, the "Hydride VPE Coating" as described by G. Beuchet et al (Journal of Crystal Growth 57 (1982), pp 379 to 386). The insertion of heated sources as required for the "Chloride" process as described by L. L. Taylor et al (Journal of Crystal Growth 64 (2983), pp 55 to 59) can likewise be carried out in an advantageous manner with the aid of the system as shown in FIG. 2.

In cases where the semiconductor wafer 40 has to be moved several times backwards and forwards between the reaction chambers 70 and 71—for instance, when two layers are grown several times alternatingly—the system has to be provided with a second driving mechanism 80 which, via a second pushrod 81, moves the holders 41 and the spacing members 43 from the left to the right so that, for example, a wafer 40 which has been treated in the second reaction chamber 71, is again pushed back into the first reaction chamber 70. Naturally, the transfer movements of the second driving system 80 must be in agreement with those of the first driving mechanism 63.

In FIG. 4, there are schematically shown the most important parts of the system according to FIGS. 2 and 3, with identical parts being indicated by the same reference numerals. The system comprises a process controller including a central process computer 84 which, via a bus 85, is connected to the individual control modules. A positioning controller 86 controls the driving mechanism 80 and, consequently, is determinative of the movement of the holders 41 when the semiconductor wafers 40 thereon are shifted from the second reaction chamber 71 to the first reaction chamber 70. An airlock controller 87 controls the driving mechanism of the airlock device 51 with the aid of which the terminal chamber 11 can be sealed with respect to the atmosphere. A stack controller 88 controls the driving mechanism 59 with the aid of which the holders 41 and the spacing members 42 are moved down into the storage space 47.

The gas controller 90 controls, on the one hand, the flow rate of the reaction gases through the reaction chambers 70 and 71 and, on the other hand, the supply and the exhaust of the inert gases to or from the loading station 1, the unloading station 3, the pre-chamber 10 and the terminal chamber 11, respectively.

Analogously, the stepping motor driving mechanism 63 and, consequently, the pushrod 62 are controlled by a positioning controller 92 while the driving mechanism of the airlock device 50 is controlled by an air-lock controller 93, and the driving mechanism 55 and, consequently, the piston and the driving mechanism 55 and, consequently, the piston 54 are controlled by a stack controller 94. Accordingly, these control units 92, 93 and 94 are determinative of introducing the holders 41 supporting the wafers 40, and the spacing members 43 into the pre-chamber 10, and of transferring these parts through the pre-chamber 10, the reaction region 2 and the terminal chamber 11.

A temperature-detector circuit 95 detecting the temperature of the heating device 5, and a heating-current adjusting circuit 96 together with the process computer 84, form a temperature control circuit for controlling the temperature in the reaction chambers 70, 71 with the necessary high accuracy. Depending on the number of required temperature regions, the detector circuit 95 is connected to several primary elements, and the adjusting circuit 96 is connected to several heater elements which are independent of one another. In this way, it is possible for the temperatures to be kept constant with a deviation amounting at the most $+0.5°$.

The system according to the invention permits a quasicontinuous process execution resulting in a high throughput of epitaxially coated semiconductor wafers, with the epitaxial layers being very exactly reproducible. Moreover, it is possible with the system to coat the wafers as supplied by the manufacturer, in their original sizes, e.g. with two-inch diameters, that is, there is no need for them to be cut through prior to the coating.

While we have described above the principles of our invention in connection with specific apparatus, it is to be clearly understood that this description is made only by way of example and not as a limitation to the scope of our invention as set forth in the objects thereof and in the accompanying claims.

We claim:

1. In a system for producing semiconductor layer structures by way of epitaxial growth, which comprises:
   at least one holder supporting a semiconductor wafer to be coated;
   a reaction chamber into which the holder is introduced and in which the semiconductor wafer is treated with a medium precipitating layer material onto the wafer, and a heating device by which the semiconductor wafer is heated to the temperature required for the epitaxial growth, the improvement which comprises:
   a plurality of reaction chambers for treating the semiconductor wafer with a reactive gas for precipitating material into the wafer;
   a loading station preceding said plurality of reaction chambers in which a plurality of holders can be received, and from which they are fed into said plurality of reaction chambers, an unloading station following said plurality of reaction chambers, to which the holders are fed out of said plurality of reaction chambers, said loading station and said unloading station each containing at least one storage chamber therein and means for closing said storage chamber from the atmosphere, each said storage chamber including means for storing a plurality of said holders to form a stack of said holders;
   a pre-chamber disposed between the loading station and said plurality of reaction chambers;
   a terminal chamber disposed between said plurality of reaction chambers and the unloading station;
   a gas inlet means for supplying reaction gas to said plurality of reaction chambers and gas outlet means for exhausting gas from said plurality of reaction chambers, said gas inlet means and said gas outlet means being disposed so that the reaction gas sweeps over the semiconductor wafers transversely in relation to the direction of transfer of the semiconductor wafers;
   means for supplying inert gas to the pre-chamber and terminal chamber and means for exhausting gas from the pre-chamber and terminal chamber;
   diffusion baffles between said chambers to keep the gas exchange between said chambers as small as possible; and
   a transfer mechanism including a first driving mechanism for individual removing a respective holder and semiconductor wafer from the stack in the storage chamber of said loading station and transferring said respective holder and semiconductor wafer through said prechamber, said reaction chambers, and said terminal chamber to the storage chamber of said unloading station where said respective holders and semiconductor wafers are restacked, and a second driving mechanism for transferring the respective holders and semiconductor wafers in a direction opposite to the direction of transfer caused by said first driving mechanism.

2. A system as claimed in claim 1, wherein said holders are stacked vertically one on top of another in said storage chambers and said first driving mechanism includes pushing means for pushing said holders in a horizontal direction; and further comprising: guide means for guiding said holders along a horizontal path through said pre-chamber, said reaction chamber and said terminal chamber; drive means for moving the stack of said holders in the storage chamber of said loading station in a vertical direction to bring a respective one of said holders in line with the horizontal path of said guide means so that said pushing means can push said respective holders horizontally into the horizontal path of said guide means.

3. A system as claimed in claim 1, and further comprising: means for sealing a respective one of said pre-chamber and said terminal chamber from the atmosphere when a respective one of said storage chambers is exposed to the atmosphere.

* * * * *